United States Patent
Clark

(10) Patent No.: US 7,767,262 B2
(45) Date of Patent: Aug. 3, 2010

(54) NITROGEN PROFILE ENGINEERING IN NITRIDED HIGH DIELECTRIC CONSTANT FILMS

(75) Inventor: Robert D. Clark, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 342 days.

(21) Appl. No.: 11/537,245

(22) Filed: Sep. 29, 2006

(65) Prior Publication Data

US 2008/0081113 A1     Apr. 3, 2008

(51) Int. Cl.
*C23C 16/00* (2006.01)

(52) U.S. Cl. .............. 427/248.1; 427/255.28; 438/3; 438/618; 438/622; 438/637; 438/639

(58) Field of Classification Search .............. 427/248.1, 427/255.28; 438/618, 3, 622, 637, 639, 627, 438/643, 653.7, 91, 769, 792
See application file for complete search history.

(56) References Cited

U.S. PATENT DOCUMENTS

| | | | |
|---|---|---|---|
| 5,888,870 A | 3/1999 | Gardner et al. | |
| 6,200,898 B1 | 3/2001 | Tu | |
| 6,511,925 B1 | 1/2003 | Aronowitz et al. | |
| 6,730,164 B2 | 5/2004 | Vaartstra et al. | |
| 6,858,546 B2 | 2/2005 | Niinisto et al. | |
| 6,914,312 B2 | 7/2005 | Nishikawa et al. | |
| 7,122,464 B2 * | 10/2006 | Vaartstra | 438/627 |
| 7,312,139 B2 * | 12/2007 | Wang et al. | 438/591 |
| 7,378,129 B2 * | 5/2008 | Kraus et al. | 427/255.394 |
| 7,456,064 B2 * | 11/2008 | Manchanda et al. | 438/240 |
| 2002/0135030 A1 | 9/2002 | Horikawa | |

(Continued)

FOREIGN PATENT DOCUMENTS

EP     1548839     6/2005

(Continued)

OTHER PUBLICATIONS

Xu et al., A Chemical Mechanism for Nitrogen Incorporation into HfO2 ALD Films Using Ammonia And Alkylamide As Precursors, Surface Science 591 (2005) L280-L285.

(Continued)

*Primary Examiner*—Shamim Ahmed
*Assistant Examiner*—Maki A Angadi
(74) *Attorney, Agent, or Firm*—Wood, Herron & Evans, LLP

(57) ABSTRACT

A method of forming a nitrided high-k film by disposing a substrate in a process chamber and forming the nitrided high-k film on the substrate by a) depositing a nitrogen-containing film, and b) depositing an oxygen-containing film, wherein steps a) and b) are performed in any order, any number of times, so as to oxidize at least a portion of the thickness of the nitrogen-containing film. The oxygen-containing film and the nitrogen-containing film contain the same one or more metal elements selected from alkaline earth elements, rare earth elements, and Group IVB elements of the Periodic Table, and optionally aluminum, silicon, or aluminum and silicon. According to one embodiment, the method includes forming a nitrided hafnium based high-k film. The nitrided high-k film can be formed by atomic layer deposition (ALD) or plasma-enhanced ALD (PEALD).

22 Claims, 6 Drawing Sheets

U.S. PATENT DOCUMENTS

| | | | |
|---|---|---|---|
| 2003/0045080 | A1 | 3/2003 | Visokay et al. |
| 2003/0060003 | A1 | 3/2003 | Hecht et al. |
| 2003/0072882 | A1 | 4/2003 | Niinisto et al. |
| 2003/0168697 | A1 | 9/2003 | Tamura et al. |
| 2004/0051126 | A1 | 3/2004 | Cuchiaro et al. |
| 2004/0123803 | A1 | 7/2004 | Strang |
| 2004/0129969 | A1 | 7/2004 | Colombo et al. |
| 2004/0132315 | A1 | 7/2004 | Chambers et al. |
| 2004/0191997 | A1 | 9/2004 | Kawahara et al. |
| 2005/0064207 | A1 | 3/2005 | Senzaki et al. |
| 2005/0104112 | A1 | 5/2005 | Haukka et al. |
| 2005/0130442 | A1* | 6/2005 | Visokay et al. ............ 438/775 |
| 2005/0136632 | A1 | 6/2005 | Rotondaro et al. |
| 2005/0156155 | A1 | 7/2005 | Atanackovic |
| 2005/0233156 | A1 | 10/2005 | Senzaki et al. |
| 2005/0272196 | A1 | 12/2005 | Wickramanayaka et al. |
| 2006/0054943 | A1 | 3/2006 | Li et al. |
| 2006/0072281 | A1 | 4/2006 | Nam et al. |
| 2006/0128092 | A1 | 6/2006 | Rouse |
| 2006/0151823 | A1 | 7/2006 | Govindarajan |
| 2006/0189154 | A1* | 8/2006 | Ahn et al. ................ 438/763 |
| 2007/0004224 | A1 | 1/2007 | Currie |
| 2007/0077750 | A1* | 4/2007 | Ma et al. ................. 438/618 |

FOREIGN PATENT DOCUMENTS

| | | |
|---|---|---|
| JP | 05024931 | 2/1993 |
| JP | 11168096 | 6/1999 |
| KR | 20060012926 A | 2/2006 |
| WO | 2004053997 A1 | 6/2004 |
| WO | 2005065402 A2 | 7/2005 |

OTHER PUBLICATIONS

Niinisto et al., Advanced Electronic and Optoelectronic Materials by Atomic Layer Deposition: an Overview with Special Emphasis on Recent Progress in Processing of High-k Dielectrics and Other Oxide Materials, Phys. Stat. Sol. (A) 201, No. 7, 1443-1452 (2004).
Kim et al., Highly Conductive HfNx Films Prepared by Plasma-assisted Atomic Layer Deposition, Electromechanical and Solid-State Letters, 9 (8) C123-C125 (2006).
Becker et al., Atomic Layer Deposition of Insulating Hafnium and Zirconium Nitrides, Chem. Mater. 2004, 16, 3497-3501.
Xu et al., Atomic Layer Depositin of Hafnium Nitrides Using Ammonia and Alkylamide Precursors, Chemical Physical Letters 407 (2005) 272-275.
U.S. Patent and Trademark Office, Non-final Office Action received in related U.S. Appl. No. 11/537,492 dated Dec. 1, 2008, 19 pp.
Schlom, Darrel G. et al., Gate Oxides Beyond SiO2, MRS Bulletin, vol. 33, Nov. 2008, www.mrs.org/bulletin, pp. 1017-1025.
U.S. Patent and Trademark Office, Non-final Office Action received in related U.S. Appl. No. 11/278,396 dated Oct. 2, 2008, 20 pp.
U.S. Patent and Trademark Office, Non-Final Office Action received in related U.S. Appl. No. 11/278,397 dated Sep. 4, 2008, 23 pp.
U.S. Patent and Trademark Office, Non-Final Office Action received in related U.S. Appl. No. 11/278,399 dated Sep. 2, 2008,18 pp.
European Patent Office, International Search Report and Written Opinion received in related International Application No. PCT/US2007/079681 dated Sep. 1, 2008, 13 pp.
U.S. Patent and Trademark Office, Non-Final Office Action received in related U.S. Appl. No. 11/278,393 dated Aug. 22, 2008, 21 pp.
U.S. Patent and Trademark Office, Non-final Office Action received in related U.S. Appl. No. 11/278,387 dated Aug. 22, 2008, 23 pp.
U.S. Patent and Trademark Office, Non-final Office Action received in related U.S. Appl. No. 11/278,399 dated Jan. 10, 2008, 25 pp.
European Patent Office, International Search Report and Written Opinion received in related International Application No. PCT/US2007/065331 dated Dec. 17, 2007, 17 pp.
European Patent Office, International Search Report and Written Opinion from related International Application No. PCT/US2007/065051 dated Nov. 30, 2007, 19 pp.
European Patent Office, International Search Report and Written Opinion from corresponding International Application No. PCT/US2007/065342 dated Sep. 21, 2007, 18 pp.
European Patent Office, Invitation to Pay Additional Fees received in related International Application No. PCT/US2007/065051 dated Sep. 20, 2007, 7 pp.
European Patent Office, Invitation to Pay Additional Fees received in related International Application No. PCT/US2007/065331 dated Sep. 9, 2007, 7 pp.
European Patent Office, International Search Report and Written Opinion from corresponding International Application No. PCT/US2007/065024 dated Aug. 20, 2007, 8 pp.
European Patent Office, International Search Report and Written Opinion from corresponding International Application No. PCT/US2007/065323 dated Aug. 17, 2007, 10 pp.
European Patent Office, Invitation to Pay Additional Fees from corresponding International Application No. PCT/US2007/065342 dated Jul. 23, 2007, 7 pp.
Myllymaki et al., High-permittivity SCcO3 Thin Films by Atomic Layer Deposition Using Two Precursor Approaches, J. Mater. Chem. R Soc. Chem, UK, vol. 16, No. 6, Dec. 14, 2006, pp. 563-569.
Nakagawa et al., Magnetocaloric effects of binary rare earth mononitrides, GdxTb1-xN and TbxHo1-xN; Journal of Alloys and Compounds, Feb. 9, 2006, pp. 187-190, vol. 408-412, Elsevier, Sequoia, Lausanne, Switzerland.
S.A. Shelvin et al, Ab initio design of high-k dielectric: LaxY103; Abstract, Physical Review Letters APS USA, vol. 94, No. 14, Apr. 13, 2005, 1 pg.
Ohmi et al., Electrical Characteristics of Rare-Earth Oxides Stacked-layer Structures, Gate Insulator, IWGI, Nov. 6, 2003, pp. 28-31.
U.S. Patent and Trademark Office, Final Office Action received in related U.S. Appl. No. 11/278,393 dated Apr. 17, 2009, 17 pp.
U.S. Patent and Trademark Office, Final Office Action received in related U.S. Appl. No. 11/278,399 dated Apr. 17, 2009, 26 pp.
U.S. Patent and Trademark Office, Final Office Action received in related U.S. Appl. No. 11/278,387 dated Apr. 3, 2009, 15 pp.
U.S. Patent and Trademark Office, Final Office Action received in related U.S. Appl. No. 11/278,397 dated Mar. 10, 2009, 10 pp.
U.S. Patent and Trademark Office, Final Office Action received in related U.S. Appl. No. 11/278,396 dated Jun. 2, 2009, 13 pp.
U.S. Patent and Trademark Office, Non-Final Office Action received in related U.S. Appl. No. 11/278,387 dated Sep. 4, 2009, 8 pp.
U.S. Patent and Trademark Office, Non-Final Office Action received in related U.S. Appl. No.11/278,393 dated Oct. 7, 2009, 9 pp.
U.S. Patent and Trademark Office, Non-Final Office Action received in related U.S. Appl. No. 11/278,396, dated Oct. 7, 2009, 9 pp.
U.S. Patent and Trademark Office, Non-Final Office Action received in related U.S. Appl. No. 11/278,399, dated Sep. 22, 2009, 22 pp.
U.S. Patent and Trademark Office, Advisory Action received in related U.S. Appl. No. 11/278,397, dated May 29, 2009, 6 pp.
U.S. Patent and Trademark Office, Non-Final Office Action received in related U.S. Appl. No. 11/278,397 dated Feb. 4, 2010, 15 pp.
U.S. Patent and Trademark Office, Final Office Action received in related U.S. Appl. No. 11/278,399 dated Feb. 24, 2010, 16 pp.
Ovanesyan et al., Single Crystal Growth and Characterization of LaLu03, Optical Materials 10 (1998) 291-295.
Xue et al., Dielectric Constants of Binary Rare-Earth Compounds, J. Phys.: Condens. Matter 12 (2000) 3113-3118.
Schlom et al., A Thermodynamic Approach to Selecting Alternative Gate Dielectrics, MRS Bulletin, Mar. 2002.
Leskela et al., Rare-Earth Oxide Thin Films as Fate Oxides in MOSFET Transistors, Journal of Solid State Chemistry 171 (2003) 170-174.
Robertson, High Dielectric Constant Oxides, Eur. Phys. J. Appl. Phys. 28, 265-291 (2004.
Zhao et al., Ternary Rare-Earth Metal Oxide High-k Layers on Silicon Oxide, Applied Physics Letters 86, 132903 (2005).
Schlom, High-k Candidates for Use as the Gate Dielectric in Silicon Mosfets, Thin Films and Heterostructures for Oxide Electronics, Chapter 2, pp. 31-78, 2005.
Wang et al., Atomic Layer Deposition of Lanthanum-Based Ternary Oxides, Electrochemical and Solid State Letters, 12 (4) G13-G15 (2009).

Kosola A et al: "Neodymium oxide and neodymium aluminate thin films by atomic layer deposition" Thin Solid Films, vol. 279, No. 1-2, Jan. 5, 2005, pp. 152-159, XP004807814 Elsevier-Sequoia S.A. Lausanne [CH] ISSN: 0040-6090.

European Patent Office, Communication Pursuant to Article 94(3) EPC, received in related European Application No. 07 759 461.2, dated Apr. 7, 2010, 4 pp.

U.S. Patent and Trademark Office, Final Office Action received in related U.S. Appl. No. 11/278,393 dated Apr. 1, 2010, 20 pp.

U.S. Patent and Trademark Office, Final Office Action received in related U.S. Appl. No. 11/278,396 dated Apr. 1, 2010, 18 pp.

* cited by examiner

NITROGEN PROFILE ENGINEERING IN NITRIDED HIGH DIELECTRIC CONSTANT FILMS

CROSS REFERENCE TO RELATED APPLICATION

This application is related to co-pending U.S. patent application Ser. No. 11/537,492, filed on even date herewith and entitled "SEMICONDUCTOR DEVICES CONTAINING NITRIDED HIGH DIELECTRIC CONSTANT FILMS," and copending U.S. patent application Ser. No. 11/278,396 and entitled "METHOD OF FORMING MIXED RARE EARTH OXYNITRIDE AND ALUMINUM OXYNITRIDE FILMS BY ATOMIC LAYER DEPOSITION." The entire contents of these applications are herein incorporated by reference in their entirety.

FIELD OF INVENTION

The present invention relates to a method of forming high dielectric constant materials for semiconductor devices, and more particularly to a method of forming nitrided high dielectric constant films having a nitrogen gradient across a thickness of the films.

BACKGROUND OF THE INVENTION

Traditionally, thermal silicon oxide ($SiO_2$) films, grown thermally from Si substrates, have been used as gate dielectric films in integrated circuits. More recently, silicon oxynitride (SiON) films have been introduced as the gate dielectric films have become ultra-thin, often only a few atomic layers thick. Incorporation of nitrogen into $SiO_2$ films to form the SiON films has been shown to provide several advantages, including an increase in the dielectric constant (k) of the films and reduced boron penetration through the films. However, as the thickness of the ultra-thin SiON films is further reduced, acceptable leakage currents cannot be maintained.

In order to enable manufacturing of advanced integrated devices, high-dielectric constant (high-k) materials are being implemented as gate dielectric films to replace or supplement $SiO_2$ and SiON films. However, many high-k dielectric materials under evaluation suffer from various problems, such as film crystallization during anneals, growth of interfacial layers during film deposition and further processing, high density of interface traps, reduced channel mobility, reaction with poly-silicon gates, and Fermi level pinning with metal gates. Furthermore, many high-k dielectric materials have dielectric constants that are lower than is desired for many advanced semiconductor devices. Additionally, the dielectric constant of the high-k dielectric materials is lowered by the presence of an interfacial layer formed between the high-k dielectric material and the underlying substrate.

Nitrogen-incorporation into high-k dielectric materials may reduce formation of the interfacial layer between the high-k dielectric material and the underlying substrate and may further reduce dopant penetration into the high-k dielectric material. Nitrogen-incorporation into high-k dielectric materials is commonly performed by post-deposition plasma processing but this can be more difficult than for conventional silicon-based dielectric materials and may cause plasma damage of the high-k dielectric material.

Accordingly, there is a need for further developments for forming high-k dielectric materials to be used in semiconductor devices, such as capacitors and transistors.

SUMMARY OF THE INVENTION

Embodiments of the invention provide a method for forming nitrided high-k films having a nitrogen gradient across a thickness of the films. The nitrided high-k films may be deposited by atomic layer deposition (ALD) or plasma-enhanced ALD (PEALD). For example, the nitrided high-k films may be used in advanced semiconductor devices that include capacitors and transistors.

According to one embodiment of the invention, the method includes disposing a substrate in a process chamber, and forming a nitrided high-k film on the substrate by a) depositing a nitrogen-containing film, and b) depositing an oxygen-containing film, where steps a) and b) are performed, in any order, any number of times, so as to oxidize at least a portion of the thickness of the nitrogen-containing film. The nitrogen-containing film and the oxygen-containing film contain the same one or more metal elements selected from alkaline earth elements, rare earth elements, and Group IVB elements of the Periodic Table, and optionally aluminum, silicon, or aluminum and silicon.

According to another embodiment of the invention, the nitrogen-containing film and the oxygen-containing film each contain hafnium, optionally one or more additional metal elements selected from alkaline earth elements, rare earth elements, and Group IVB elements of the Periodic Table, and optionally aluminum, silicon, or aluminum and silicon.

DETAILED DESCRIPTION OF SEVERAL EMBODIMENTS OF THE INVENTION

Figure 1A:
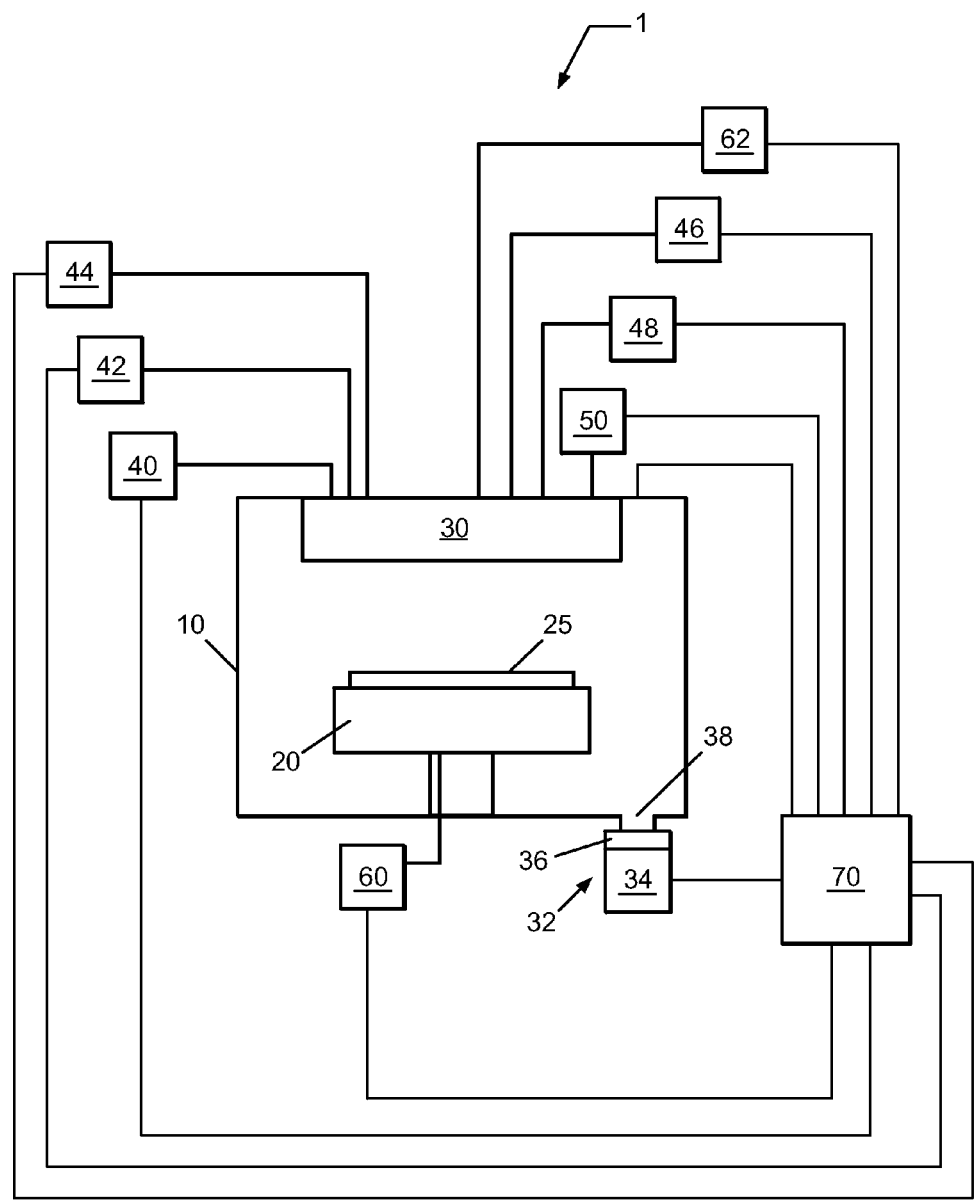
FIG. 1A depicts a schematic view of an ALD processing system in accordance with an embodiment of the invention.

Nitrided dielectric materials such as hafnium based dielectric materials are likely to provide beneficial thermal and electrical characteristics for future high-k applications in semiconductor devices. Expected benefits of these dielectric materials include increased thermal stability in contact with silicon or metal gate electrode material, decreased dopant diffusion, increased crystallization temperature, increased dielectric constant compared to non-nitrided materials, decreased density of interface traps, decreased threshold voltage shifts and Fermi level pinning, and improved processing characteristics. For example, these dielectric material films can be used in applications that include future generations of high-k dielectric materials for use as both capacitor and transistor gate dielectrics.

Embodiments of the invention provide a method for nitrogen profile engineering in nitrided high-k films, in particular to forming nitrided high-k films having a nitrogen gradient across a thickness of the film. The method can provide different nitrogen-profiles in the nitrided high-k films that are expected to be beneficial for device characteristics. The nitrided high-k films contain an oxygen-containing film, and a nitrogen-containing film that is at least partially oxidized during the deposition of the oxygen-containing film onto the nitrogen-containing film, or oxidized during, or after deposition of the nitrogen-containing film by additional processing within the process chamber. The additional processing can include exposing the substrate to an oxygen-containing gas. In one example, a nitrided high-k film can contain an oxygen-containing film deposited onto a substrate and a nitrogen-containing film deposited onto the oxygen-containing film. In another example, a nitrided high-k film can contain nitrogen-containing film deposited onto a substrate and an oxygen-containing film deposited onto the nitrogen-containing film. According to other embodiments of the invention, the nitrided high-k film can contain a plurality of alternating oxygen-containing films and nitrogen-containing films.

Embodiments of the invention can utilize ALD or PEALD processing to deposit nitrided high-k films with high film uniformity and with excellent thickness control over high aspect ratio features. The nitrided high-k films can contain one or more metal elements selected from alkaline earth elements (Be, Mg, Ca, Sr, Ba, and Ra), rare earth elements (scandium, yttrium, lanthanum of Group IIB, and the 14 lanthanides that fill the 4f electron shell), and Group IVB elements (Ti, Zr, and Hf) of the Periodic Table. In addition, the nitrided high-k films may further contain aluminum, silicon, or both aluminum and silicon.

In the following description, in order to facilitate a thorough understanding of the invention and for purposes of explanation and not limitation, specific details are set forth, such as a particular geometry of ALD or PEALD processing systems and descriptions of various components of the processing systems. However, it should be understood that the invention may be practiced in other embodiments that depart from these specific details.

Referring now to the drawings, FIG. 1A illustrates an ALD processing system 1 for depositing nitrided high-k films on a substrate according to one embodiment of the invention. The ALD processing system 1 includes a process chamber 10 having a substrate holder 20 configured to support a substrate 25, upon which the nitrided high-k film is formed. The process chamber 10 further contains an assembly 30 (e.g., a showerhead) coupled to a first process material supply system 40, a second process material supply system 42, a purge gas supply system 44, an oxygen-containing gas supply system 46, a nitrogen-containing gas supply system 48, an aluminum-containing gas supply system 50, and a silicon-containing gas supply system 62. Additionally, the ALD processing system 1 includes a substrate temperature control system 60 coupled to substrate holder 20 and configured to elevate and control the temperature of substrate 25. Furthermore, the ALD processing system 1 includes a controller 70 that can be coupled to the process chamber 10, substrate holder 20, assembly 30 configured for introducing process gases into the process chamber 10, first process material supply system 40, second process material supply system 42, purge gas supply system 44, oxygen-containing gas supply system 46, nitrogen-containing gas supply system 48, aluminum-containing gas supply system 50, silicon-containing gas supply system 62, and substrate temperature control system 60.

Alternatively, or in addition, controller 70 can be coupled to one or more additional controllers/computers (not shown), and controller 70 can obtain setup and/or configuration information from an additional controller/computer.

In FIG. 1A, singular processing elements (10, 20, 30, 40, 42, 44, 46, 48, 50, 60, and 62) are shown, but this is not required for the invention. The ALD processing system 1 can include any number of processing elements having any number of controllers associated with them in addition to independent processing elements.

The controller 70 can be used to configure any number of processing elements (10, 20, 30, 40, 42, 44, 46, 48, 50, 60, and 62), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1A, the ALD processing system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch ALD processing system capable of processing multiple substrates simultaneously may be utilized for depositing the nitrided high-k films described in the embodiments of the invention.

The first process material supply system 40 and the second process material supply system 42 are configured to alternately or simultaneously introduce metal-containing precursors containing one or more metal elements selected from alkaline earth elements, rare earth elements, and Group IVB elements of the Periodic Table. The alternation of the introduction of the metal-containing precursors can be cyclical, or it may be acyclical with variable time periods between introduction of the one or more metal-containing precursors. Furthermore, each of the first process material supply system 40 and the second process material supply system 42 may each be configured to alternately or simultaneously introduce a plurality of metal-containing precursors to the process chamber 10, where the plurality of metal-containing precursors contain different metal elements selected from alkaline earth elements, rare earth elements, and Group IVB elements.

According to embodiments of the invention, several methods may be utilized for introducing the metal-containing precursors to the process chamber 10. One method includes vaporizing precursors through the use of separate bubblers or direct liquid injection systems, or a combination thereof, and then mixing in the gas phase within or prior to introduction into the process chamber 10. By controlling the vaporization rate of each metal-containing precursor separately, a desired metal element stoichiometry can be attained within the deposited nitrided high-k film. Another method of delivering each metal-containing precursor includes separately controlling two or more different liquid sources, which are then mixed prior to entering a common vaporizer. This method may be utilized when the metal-containing precursors are compatible in solution or in liquid form and they have similar vaporization characteristics. Other methods include the use of compatible mixed solid or liquid precursors within a bubbler. Liquid source precursors may include neat liquid metal-containing precursors, or solid or liquid metal-containing precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the various precursors within a gas pulse, it is possible to deposit mixed metal-containing films with desired stoichiometries.

Embodiments of the inventions may utilize a wide variety of different alkaline earth precursors. For example, many alkaline earth precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4 tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethyl-propionitrile.

Representative examples of alkaline earth precursors include:

Be precursors: $Be(N(SiMe_3)_2)_2$, $Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4Cp)_2$, and $Ca(Me_5Cp)_2$.

Sr precursors: Bis(tert-butylacetamidinato)strontium (TBAASr), Sr—C, Sr-D, $Sr(N(SiMe_3)_2)_2$, $Sr(THD)_2$, $Sr(THD)_2$(tetraglyme), $Sr(iPr_4Cp)_2$, $Sr(iPr_3Cp)_2$, and $Sr(Me_5Cp)_2$.

Ba precursors: Bis(tert-butylacetamidinato)barium (TBAABa), Ba—C, Ba-D, $Ba(N(SiMe_3)_2)_2$, $Ba(THD)_2$, $Ba(THD)_2$(tetraglyme), $Ba(iPr_4Cp)_2$, $Ba(Me_5Cp)_2$, and $Ba(nPrMe_4Cp)_2$.

Representative examples of Group IVB precursors include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $Ti(mmp)_4$, $HfCl_4$, $ZrCl_4$, $TiCl_4$, $Ti(NiPr_2)_4$, $Ti(NiPr_2)_3$, tris(N,N'-dimethylacetamidinato)titanium, $ZrCp_2Me_2$, $Zr(tBuCp)_2Me_2$, $Zr(NiPr_2)_4$, $Ti(OiPr)_4$, $Ti(O^tBu)_4$ (titanium tert-butoxide, TTB), $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), and $Ti(THD)_3$ (tris(2,2,6,6-tetramethyl-3,5-heptanedionato)titanium).

Embodiments of the inventions may utilize a wide variety of different rare earth precursors. For example, many rare earth precursors have the formula:

$$ML^1L^2L^3D_x$$

where M is a rare earth metal element selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L groups and D ligands are identical to those presented above for the alkaline earth precursor formula.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4CP)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, Pr(O $(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 1A, the oxygen-containing gas supply system 46 is configured to introduce an oxygen-containing gas to the process chamber 10. The oxygen-containing gas can include oxygen ($O_2$), water ($H_2O$), or hydrogen peroxide ($H_2O_2$), or a combination thereof, and optionally an inert gas such as Ar. Similarly, the nitrogen-containing gas supply system 48 is configured to introduce a nitrogen-containing gas to the process chamber 10. The nitrogen-containing gas can include ammonia ($NH_3$), hydrazine ($N_2H_4$), $C_1$-$C_{10}$ alkylhydrazine compounds, or a combination thereof, and optionally an inert gas such as Ar. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe).

According to one embodiment of the invention, the oxygen-containing gas or the nitrogen-containing gas can include NO, $NO_2$, or $N_2O$, or a combination thereof, and optionally an inert gas such as Ar.

Embodiments of the invention may utilize a wide variety of aluminum precursors for incorporating aluminum into the nitrided high-k films. For example, many aluminum precursors have the formula:

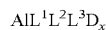

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $Al_2Me_6$, $Al_2Et_6$, $[Al(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Embodiments of the invention may utilize a wide variety of silicon precursors for incorporating silicon into the nitrided high-k films. Examples of silicon precursors include $SiH_4$, $Si_2H_6$, $SiCl_3H$, $SiCl_2H_2$, $SiClH_3$, $Si_2Cl_6$, $((CH_3)_2N)_3SiH$ (tris(dimethylamino)silane, TDMAS), and $((CH_3)_2N)_2SiH_2$ (bis(dimethylamino)silane, TDMAS).

Still referring to FIG. 1A, the purge gas supply system 44 is configured to introduce a purge gas to process chamber 10. For example, the introduction of purge gas may occur between introduction of pulses of metal-containing precursors and an oxygen-containing gas, a nitrogen-containing gas, an aluminum precursor, and a silicon precursor to the process chamber 10. The purge gas can comprise an inert gas, such as a noble gas (i.e., He, Ne, Ar, Kr, or Xe), nitrogen ($N_2$), or hydrogen ($H_2$).

Furthermore, ALD processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the ALD processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular nitrided high-k film on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the nitrided high-k film on the substrate 25. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can be, for example, an absolute capacitance manometer. The pressure control system 32 can, for example, be configured to control the process chamber pressure between about 0.1 Torr and about 100 Torr during deposition of the nitrided high-k film.

The first process material supply system 40, the second process material supply system 42, the purge gas supply system 44, the oxygen-containing gas supply system 46, the nitrogen-containing gas supply system 48, the aluminum-containing gas supply system 50, and the silicon-containing gas supply system 62 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for metal-containing precursors can be between 0.3 and 3 sec, for example 1 sec. Exemplary gas pulse lengths for aluminum precursors and silicon-precursors can be between 0.1 and 3 sec, for example 0.3 sec. Exemplary gas pulse lengths for oxygen- and nitrogen-containing gases can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 1A, the controller 70 can comprise a microprocessor, memory, and a digital I/O port capable of generating control voltages sufficient to communicate and activate inputs to the ALD processing system 1 as well as monitor outputs from the ALD processing system 1. Moreover, the controller 70 may be coupled to and may exchange information with the process chamber 10, substrate holder 20, upper assembly 30, first process material supply system 40, second process material supply system 42, purge gas supply system 44, oxygen-containing gas supply system 46, nitrogen-containing gas supply system 48, aluminum-containing gas supply system 50, silicon-containing gas supply system 62, substrate temperature control system 60, and pressure control system 32. For example, a program stored in the memory may be utilized to activate the inputs to the aforementioned components of the ALD processing system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 70 for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the ALD processing system 1, or it may be remotely located relative to the ALD processing system 1. For example, the controller 70 may exchange data with the ALD processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the ALD processing system 1 via a wireless connection.

Figure 1B:
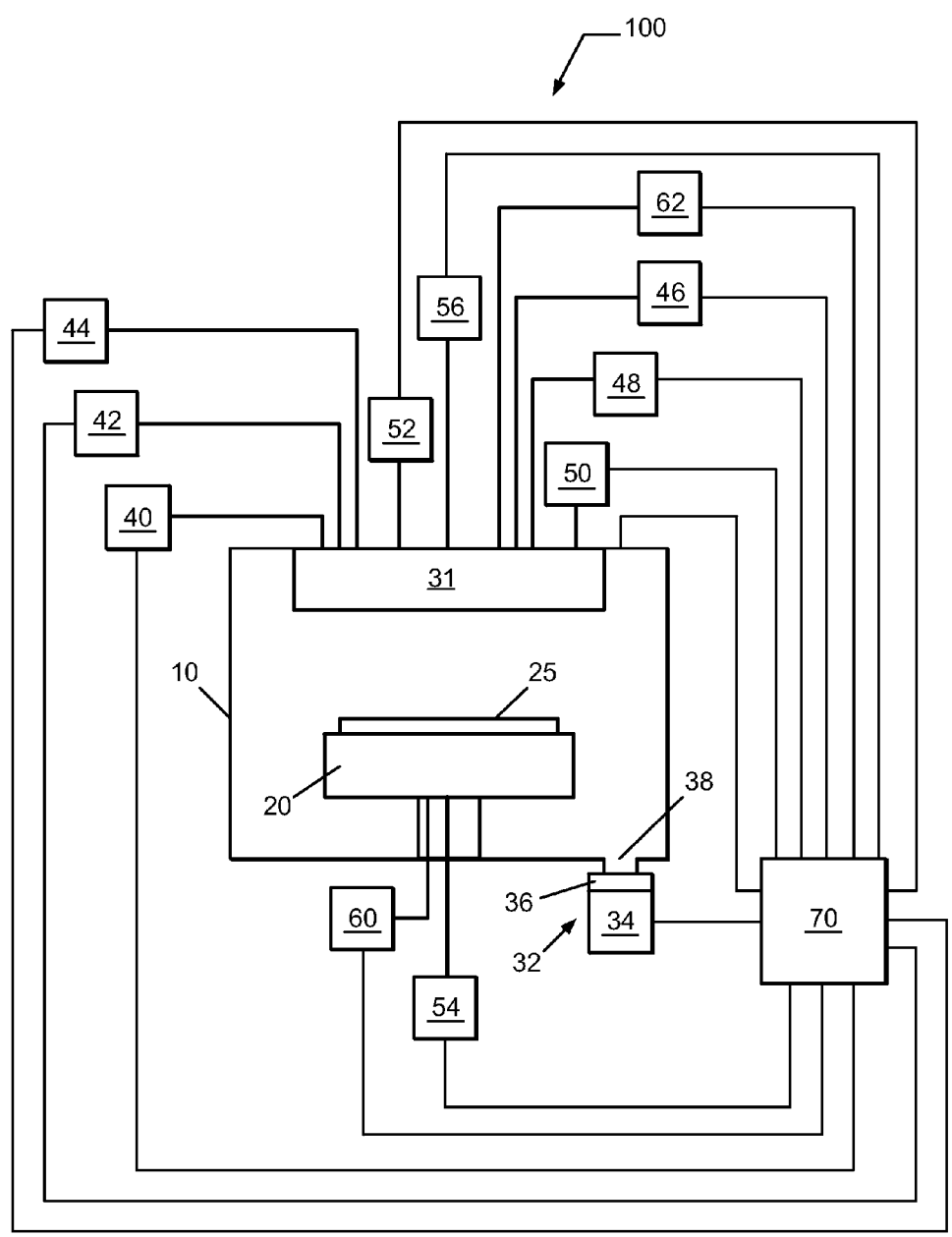
FIG. 1B depicts a schematic view of a PEALD processing system in accordance with an embodiment of the invention.

FIG. 1B illustrates a PEALD processing system 100 for depositing nitrided high-k films on a substrate according to an embodiment of the invention. The PEALD processing system 100 is similar to the ALD processing system 1 described in FIG. 1A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. In one example, a mixture of ozone/oxygen may be formed. Similarly, plasma excited nitrogen may be formed from a nitrogen gas containing $N_2$, $NH_3$, or $N_2H_4$, or a combination thereof. Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10 through the assembly 31. The first power source 52 may be a variable power source and may include a radio frequency (RF) generator and an impedance match network, and may further include an electrode through which RF power is coupled to the plasma in process chamber 10. The electrode can be formed in the assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the PEALD processing system 100 includes a substrate bias generation system configured to generate or assist in generating a plasma (through substrate holder biasing) during at least a portion of the alternating introduction of the gases to the process chamber 10. The substrate bias system can include a substrate power source 54 coupled to the process substrate holder 20, and configured to couple power to the substrate 25. The substrate power source 54 may include a RF generator and an impedance match network, and may further include an electrode through which RF power is coupled to substrate 25. The electrode can be formed in substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the PEALD processing system 100 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 25. The remote plasma system 56 can, for example, contain a microwave frequency generator. The process chamber pressure can be between about 0.1 Torr and about 10 Torr, or between about 0.2 Torr and about 3 Torr. In one example, the remote plasma system can provide a mixture of ozone and $O_2$ to the substrate 25.

FIGS. 2A-2E schematically illustrate pulse sequences for forming nitrided high-k films according to embodiments of the invention. Sequential and alternating pulse sequences are used to deposit the different components (i.e., metal elements, aluminum, oxygen, nitrogen, and silicon) of the nitrided high-k films. Since ALD and PEALD processes typically deposit less than a monolayer of material per gas pulse, it is possible to form a homogenous material using separate deposition sequences of the different components of the film. Depending on the gas selections and combination of pulse sequences, a wide variety of nitrided high-k materials may be formed that contain one or more metal elements from alkaline earth elements, rare earth elements, and Group IVB elements. The nitrided high-k film can contain a wide variety of nitrogen-containing films and oxygen-containing films. Nitrogen-containing films may be selected from metal nitride films, metal aluminum nitride films, metal silicon nitride films, and metal silicon aluminum nitride films. Oxygen-containing films may be selected from metal oxide films, metal aluminate films, metal silicate films, and metal silicon aluminate films.

Figure 2A:
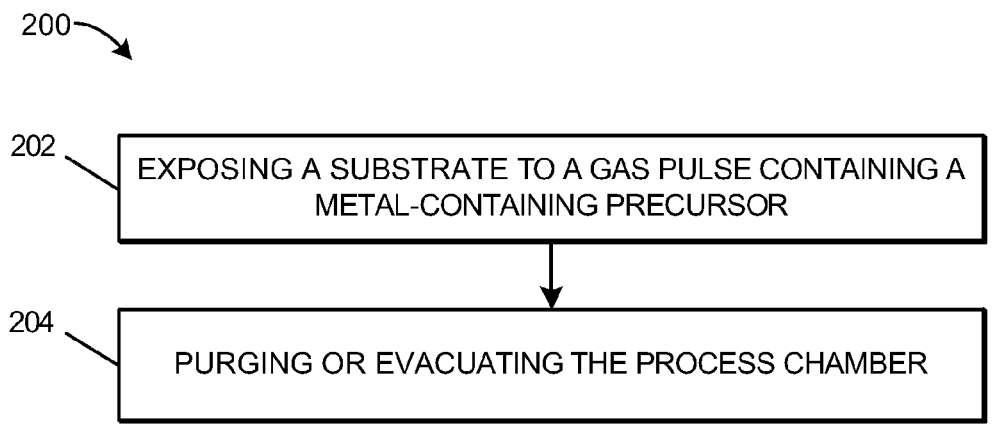
FIGS. 2A-2E schematically illustrate pulse sequences for forming nitrided high-k films according to embodiments of the invention.
Figure 2B:
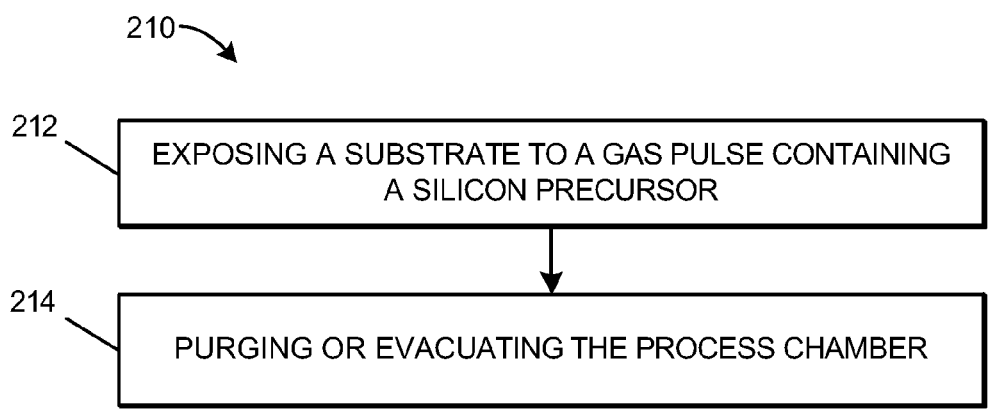
Figure 2C:
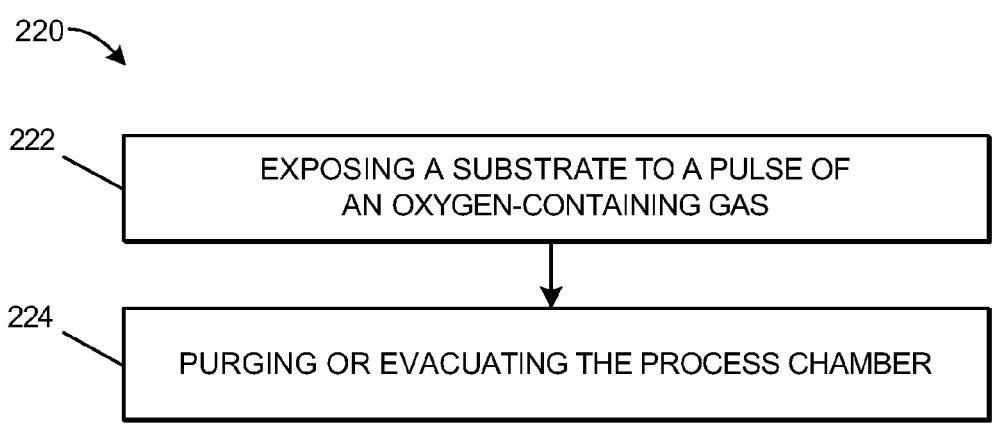
Figure 2D:
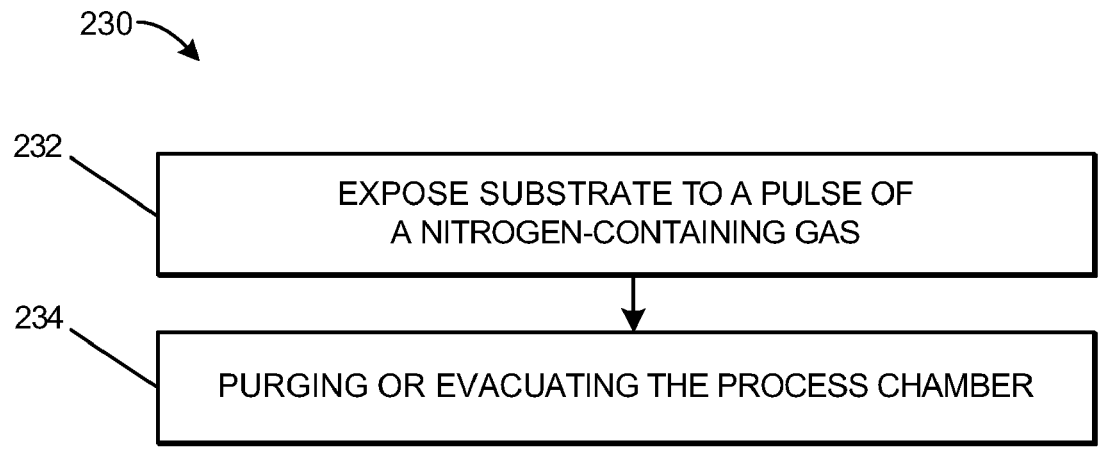
Figure 2E:
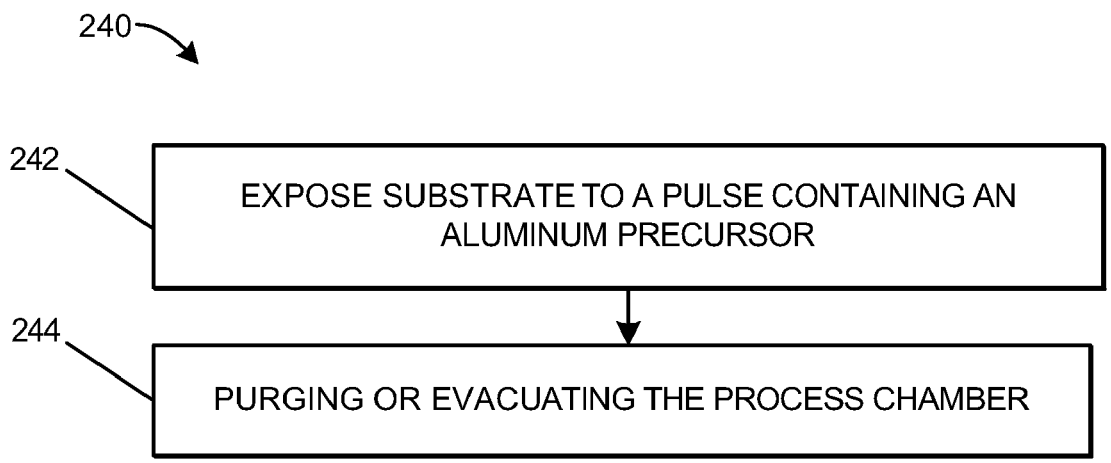

FIG. 2A depicts a pulse sequence 200 for depositing a metal element from a metal-containing precursor in step 202. FIG. 2B depicts a pulse sequence 210 for depositing silicon from a silicon precursor in step 212. FIG. 2C depicts a pulse sequence 220 for incorporating oxygen into a high-k film from exposure to an oxygen-containing gas in step 222. FIG. 2D depicts a pulse sequence 230 for incorporating nitrogen into a high-k film from exposure to a nitrogen-containing gas in step 232. FIG. 2E depicts a pulse sequence 240 for depositing aluminum from an aluminum precursor in step 252.

According to the embodiments depicted in FIGS. 2A-2E, each of the pulse sequences 200, 210, 220, 230, and 240 may include a respective purge or evacuation step 204, 214, 224, 234, and 244 to remove unreacted gas or byproducts from the process chamber. As used herein, purging steps may further include evacuating the process chamber during the purging.

According to another embodiment of the invention, one or more of the purge or evacuation steps 204, 214, 224, 234, and 244 may be omitted.

Figure 3:
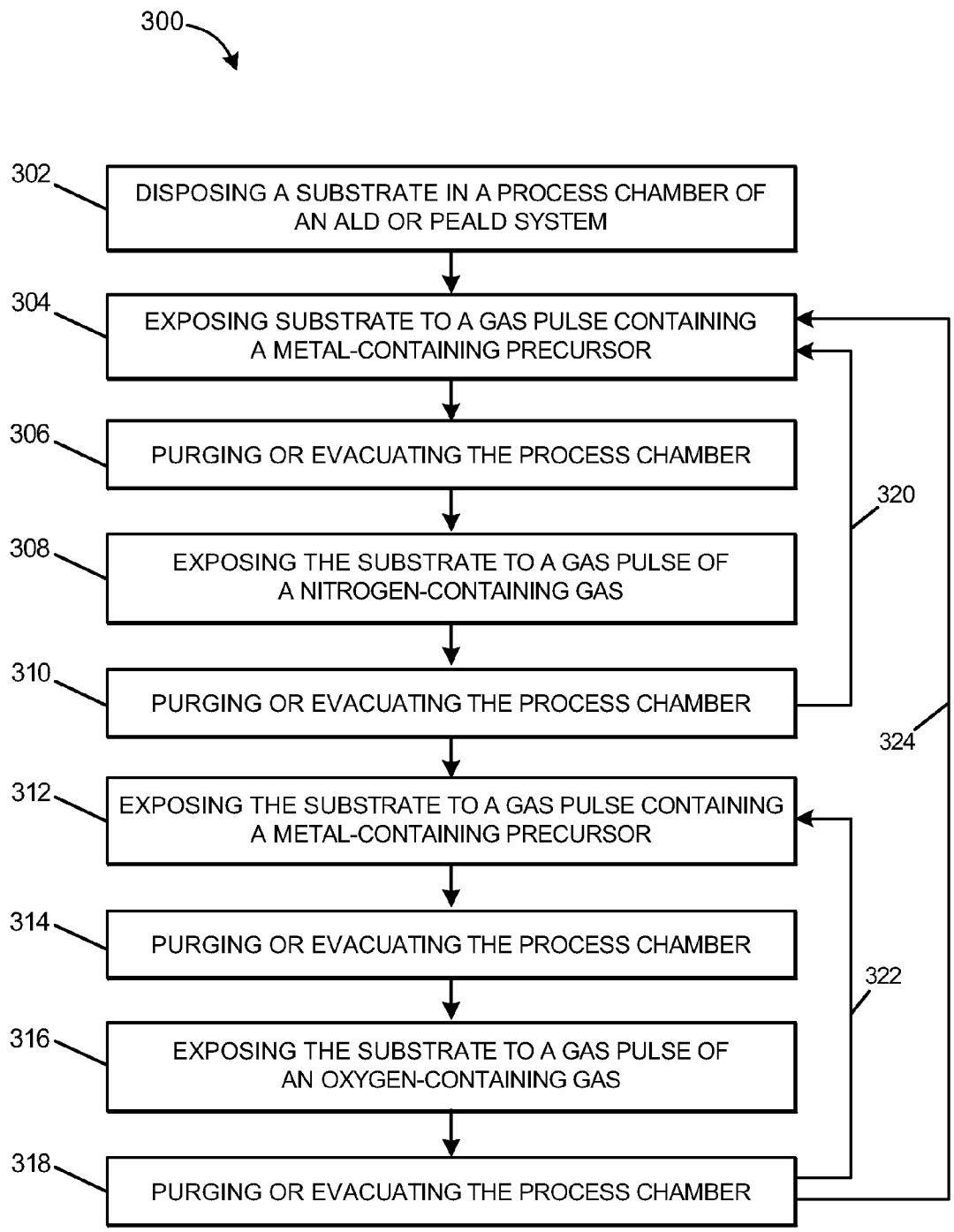
FIG. 3 is a process flow diagram for forming nitrided high-k films according to embodiments of the invention.

FIG. 3 is a process flow diagram for forming nitrided high-k films according to embodiments of the invention. The process flows of FIG. 3 may be performed by the ALD/PEALD processing systems 1/101 of FIGS. 1, 2, or any other suitable ALD/PEALD processing systems configured to perform an ALD/PEALD process. In FIG. 3, the process 300 begins when a substrate, such as a semiconductor substrate, is disposed in a process chamber of an ALD or PEALD processing system in step 302. In step 304, the substrate is exposed to a gas pulse containing a metal-containing precursor, and in step 306, the process chamber is purged or evacuated to remove unreacted metal-containing precursor and any byproducts from the process chamber.

In step 304, the metal-containing precursor reacts with the surface of the heated substrate to form a chemisorbed layer less than a monolayer thick containing the metal element. The chemisorbed layer is less than a monolayer thick due to the large size of the metal-containing precursor compared to the size of the metal element contained in the metal-containing precursor.

In step 308, the substrate is sequentially exposed to a gas pulse of a nitrogen-containing gas, and in step 310, the process chamber is purged or evacuated to remove unreacted nitrogen-containing gas and any byproducts from the process chamber. The nitrogen-containing gas can contain $NH_3$, $N_2H_4$, $C_1$-$C_{10}$ alkylhydrazine compounds, plasma excited nitrogen, NO, $NO_2$, or $N_2O$, or a combination thereof, and optionally an inert gas such as Ar. By repeating the exposure steps 304-310 a predetermined number of times, as shown by the process flow arrow 320, it is possible to deposit a nitrogen-containing film with a desired thickness on the substrate while achieving layer by layer growth of about 1 angstrom ($10^{-10}$ m) per cycle. The desired film thickness can depend on the type of semiconductor device or device region being formed. For example, a thickness of the nitrogen-containing film can be between about 5 angstrom and about 200 angstrom, or between about 5 angstrom and about 40 angstrom.

In step 312, the substrate is exposed to a gas pulse containing a metal-containing precursor, and in step 314, the process chamber is purged or evacuated to remove unreacted metal-containing precursor and any byproducts from the process chamber. In step 316, the substrate is sequentially exposed to a gas pulse of oxygen-containing gas, and in step 318, the process chamber is purged or evacuated to remove unreacted oxygen-containing gas and any byproducts from the process chamber. The oxygen-containing gas can include $O_2$, $H_2O$, $H_2O_2$, ozone, plasma excited oxygen, NO, $NO_2$, or $N_2O$, or a combination thereof, and optionally an inert gas such as Ar. The exposure steps 312-318 may be repeated a predetermined number of times, as shown by the process flow arrow 322, to deposit an oxygen-containing film with a desired thickness on the substrate. For example, a thickness of the oxygen-containing film can be between about 5 angstrom and about 200 angstrom, or between about 5 angstrom and about 40 angstrom.

According to an embodiment of the invention, the metal-containing precursor can be the same in steps 304 and 312. According to another embodiment, the metal-containing precursors in steps 304 and 312 can have different chemical formulas but contain the same metal element. According to yet another embodiment, the metal-containing precursors in steps 304 and 312 can contain different metal elements. The process flows 320 and 322 may be repeated a predetermined number of times, as shown by the process flow arrow 324, to form a plurality of alternating nitrogen-containing films and oxygen-containing films until the desired number of alternating films has been formed.

According to an embodiment of the invention, the exposure steps 304 and 312 may contain a plurality (i.e., at least two) of metal-containing precursors each having a different metal element. Thus, the gas pulses in steps 304 and 312 may contain a plurality of different metal elements to be deposited on the substrate. The relative concentration of each metal-containing precursor in each gas pulse may be independently controlled to tailor the composition of the resulting nitrided high-k film.

According to the embodiment depicted in FIG. 3, a nitrogen-containing film is deposited onto a substrate as shown by process flow 320 and, subsequently, an oxygen-containing film is deposited onto the nitrogen-containing film as shown by process flow 322. According to another embodiment of the invention, the order of the film depositions may be reversed, i.e., an oxygen-containing film deposited onto a substrate and, subsequently, a nitrogen-containing film deposited onto the oxygen-containing film.

According to another embodiment of the invention, one or more of pulse sequences 210 and 240 depicted in FIG. 2 may be added to the process 300 for incorporating silicon, aluminum, or both silicon and aluminum, into the nitrided high-k film. For example, pulse sequence 210 may be performed after exposure steps 310 and 318 for incorporating silicon into the nitrided high-k film.

According to one embodiment of the invention, the method includes disposing a substrate in a process chamber, and forming a nitrided high-k film on the substrate by a) depositing a nitrogen-containing film, and b) depositing an oxygen-containing film, where steps a) and b) are alternatingly performed, in any order, any number of times, so as to oxidize at least a portion of the thickness of the nitrogen-containing film, and where the nitrogen-containing film and the oxygen-containing film contain the same one or more metal elements selected from alkaline earth elements, rare earth elements, and Group IVB elements of the Periodic Table, and optionally aluminum, silicon, or aluminum and silicon.

According to another embodiment of the invention, the method includes disposing a substrate in a process chamber, and forming a nitrided hafnium based high-k film on the substrate by a) depositing a nitrogen-containing film, and b) depositing an oxygen-containing film, where steps a) and b) are alternatingly performed, in any order, any number of times, so as to oxidize at least a portion of the thickness of the nitrogen-containing film, and the nitrogen-containing film and the oxygen-containing film each contain hafnium, optionally one or more additional metal elements selected from alkaline earth elements, rare earth elements, and Group IVB elements of the Periodic Table, and optionally aluminum, silicon, or aluminum and silicon.

For illustrative purposes, different regions across a thickness of a nitrided high-k film containing a nitrogen-containing film and an oxygen-containing film may be referred to as top and bottom regions. Using this exemplary description, a nitrided high-k film containing an oxygen-containing film deposited onto a substrate and a nitrogen-containing film deposited onto the oxygen-containing film may be referred to as a top nitrided high-k film since the highest nitrogen content is in the top region of the nitrided high-k film. In another example, a nitrided high-k film containing a nitrogen-containing film deposited onto a substrate and an oxygen-containing film deposited onto the nitrogen-containing film may be referred to as a bottom nitrided high-k film since the highest nitrogen content is in the bottom region of the nitrided high-k film.

Similarly, different regions across a thickness of a nitrided high-k film containing a total of three nitrogen- or oxygen-containing films may be referred to as top, middle, and bottom regions. For example, a top region can include approximately the top one third of a thickness of the nitrided high-k film, a bottom region can include approximately the bottom one third of a thickness of the nitrided high-k film nearest to the underlying substrate, and a middle region can include approximately a third of a thickness of the nitrided high-k film between the top and bottom regions. Using this exemplary description, a top nitrided high-k film has the highest nitrogen content in the top region of the nitrided high-k film. Similarly, bottom and middle nitrided high-k films have the highest nitrogen content in the bottom and middle regions of the nitrided high-k films, respectively. Furthermore, for example, a nitrided high-k film may be described as being bottom and middle nitrided if the nitrogen content is higher in the bottom and middle regions than in the top region. In another example, a nitrided high-k film may be described as being top and bottom nitrided if the nitrogen content is higher in the top and bottom regions than in the middle region. As those skilled in the art will readily recognize, each of the top, middle, and bottom regions need not be construed as being limited to approximately one thirds of a thickness of the nitrided high-k film but rather may describe regions at or near the top interface, middle (bulk), and bottom interface of the nitrided high-k film, respectively.

According to an embodiment of the invention, a nitrogen-containing film is deposited in a desired region of the nitrided high-k film using alternating pulses of a metal-containing precursor and a nitrogen-containing gas. The as-deposited nitrogen-containing film may be a metal nitride film containing little or no oxygen or, alternately, the as-deposited nitrogen-containing film may contain substantial amounts of oxygen. In one example, a substantial amount of oxygen may be incorporated into a nitrogen-containing film during deposition utilizing a metal-containing precursor containing oxygen. Furthermore, oxygen may be incorporated into the nitrogen-containing film by exposing the substrate to an oxygen-containing gas prior to, during, or after deposition of the nitrogen-containing film. For example, oxygen may be incorporated onto the nitrogen-containing film by post-deposition processing such as exposure to an oxygen-containing gas with or without a plasma, or during formation of a gate electrode or a capping layer onto the nitrided high-k film.

Furthermore, oxygen may be incorporated into a nitrogen-containing film from an adjacent oxygen-containing film during deposition of the nitrogen-containing film onto the oxygen-containing film or during deposition of the oxygen-containing film onto the nitrogen-containing film. Due to the oxygen incorporation into the nitrogen-containing film, the final nitrogen content of the nitrogen-containing film is lower than would be obtained without an oxygen-containing film adjacent to (below, above, or both below and above) the nitrogen-containing film or without post-deposition processing.

According to embodiments of the invention, oxygen incorporation into the nitrogen-containing film oxidizes at least a portion of the thickness of the nitrogen-containing film. According to one embodiment, the oxidized portion contains a variable nitrogen:oxygen ratio. In one example, a nitrogen-containing film is deposited onto a substrate, and an oxygen-containing film is deposited onto the nitrogen-containing film so as to oxidize at least a portion of the thickness of the nitrogen-containing film during the deposition of the oxygen-containing film. In this example, the nitrogen:oxygen ratio in the oxidized portion of the thickness of the nitrogen-containing film may increase in the direction towards the substrate. According to one embodiment of the invention, the nitrogen:oxygen ratio in the nitrided high-k film may monotonically change through the thickness thereof. In the above example, where a nitrogen-containing film is deposited onto a substrate and an oxygen-containing film is deposited onto the nitrogen-containing film, the nitrogen:oxygen ratio in the nitrided high-k film may monotonically increase through the thickness thereof.

Several examples of forming nitrided high-k films according to embodiments of the invention will now be described.

EXAMPLE 1

Formation of a Bottom Nitrided Hafnium Based High-k Film

A hafnium based nitrogen-containing film having a thickness between about 5 angstrom and about 10 angstrom is deposited onto a substrate at a substrate temperature between 150° C. and 350° C. using alternating pulses of TEMAH and ammonia. Next, a hafnium based oxygen-containing film having a thickness between about 10 angstrom and about 30 angstrom is deposited onto the nitrogen-containing film at a substrate temperature between 150° C. and 350° C. using alternating pulses of TEMAH and mixture of ozone/oxygen. The ozone concentration in the mixture may be between 50 and 250 g/m$^3$. Oxygen incorporation into the nitrogen-containing film during deposition of the oxygen-containing film oxidizes at a least a portion of the thickness of the nitrogen-containing film. In addition, oxygen incorporation may occur from the oxygen-containing film. Optionally, further oxygen incorporation may be achieved by additional ozone/oxygen exposure prior to, during, or after deposition of the nitrogen-containing film or after deposition of the oxygen-containing film.

EXAMPLE 2

Formation of a Middle Nitrided Hafnium Based High-k Film

A first (bottom) hafnium based oxygen-containing film having a thickness between about 5 angstrom and about 10 angstrom is deposited onto the substrate using alternating pulses of TEMAH and mixture of ozone/oxygen. Next, a (middle) hafnium based nitrogen-containing film having a thickness between about 10 angstrom and about 20 angstrom may be deposited onto the first hafnium based oxygen-containing film using alternating pulses of TEMAH and ammonia. Next, a second (top) hafnium based oxygen-containing film is deposited onto the nitrogen-containing film. The second hafnium based oxygen-containing film may have the same thickness as the first hafnium based oxygen-containing film. Oxygen incorporation into the nitrogen-containing film during deposition of the second oxygen-containing film oxidizes at least a portion of the thickness of the nitrogen-containing film. In addition, oxygen incorporation may occur from the first and second oxygen-containing film. Optionally, further oxygen incorporation may be achieved by additional ozone/oxygen exposure prior to, during, or after deposition of the nitrogen-containing film or after deposition of the second oxygen-containing film.

EXAMPLE 3

Formation of a Top Nitrided Hafnium Based High-k Film

A hafnium based oxygen-containing film having a thickness between about 10 angstrom and about 30 angstrom is deposited onto the substrate using alternating pulses of TEMAH and mixture of ozone/oxygen. A hafnium based nitrogen-containing film having a thickness between about 5 angstrom and about 10 angstrom is deposited onto the hafnium based oxygen-containing film using alternating pulses of TEMAH and ammonia. Oxygen incorporation into the nitrogen-containing film may occur from the oxygen-containing film. Optionally, further oxygen incorporation may be achieved by additional ozone/oxygen exposure prior to, during, or after deposition of the nitrogen-containing film.

EXAMPLE 4

Formation of a Top and Bottom Nitrided Hafnium Based High-k Film

A first (bottom) hafnium based nitrogen-containing film having a thickness between about 5 Angstrom and about 10 Angstrom is deposited onto the substrate using alternating pulses of TEMAH and ammonia. Next, a hafnium based oxygen-containing film having a thickness between about 10 Angstrom and about 20 Angstrom is deposited onto the nitrogen-containing film using alternating pulses of TEMAH and mixture of ozone/oxygen. Next, a second (top) hafnium based nitrogen-containing film is deposited onto the oxygen-containing film. The second nitrogen-containing film may have the same thickness as the first nitrogen-containing film. Oxygen incorporation into the first nitrogen-containing film during deposition of the oxygen-containing film oxidizes at a least a portion of the thickness of the first nitrogen-containing film. In addition, oxygen incorporation into the second nitrogen-containing film may occur from the oxygen-containing film. Optionally, further oxygen incorporation may be achieved by additional ozone/oxygen exposure prior to, during, or after deposition of the first or second nitrogen-containing films.

EXAMPLE 5

Formation of a Top Nitrided Hafnium and Silicon Based High-k Film

A hafnium and silicon based oxygen-containing film having a thickness between about 5 angstrom and about 30 angstrom is deposited onto the substrate at a substrate temperature between 150° C. and 350° C. using alternating pulses of TEMAH and mixture of ozone/oxygen, and alternating pulses of TDMAS and mixture of ozone/oxygen. A hafnium silicon based nitrogen-containing film having a thickness between about 5 angstrom and about 30 angstrom is deposited onto the hafnium silicon based oxygen-containing film using alternating pulses of TEMAH and ammonia, and alternating pulses of TDMAS and ammonia. Oxygen incorporation into the nitrogen-containing film may occur from the oxygen-containing film. Optionally, further oxygen incorporation may be achieved by additional ozone/oxygen exposure prior to, during, or after deposition of the nitrogen-containing film.

EXAMPLE 6

Formation of a Bottom Nitrided Hafnium and Silicon Based High-k Film

A hafnium and silicon based nitrogen-containing film having a thickness between about 5 angstrom and about 10 angstrom is deposited onto a substrate at a substrate temperature between 150° C. and 350° C. using alternating pulses of TEMAH and ammonia, and alternating pulses of TDMAS and ammonia. Next, a hafnium silicon based oxygen-containing film having a thickness between about 10 angstrom and about 30 angstrom is deposited onto the hafnium silicon based nitrogen-containing film at a substrate temperature between 150° C. and 350° C. using alternating pulses of TEMAH and mixture of ozone/oxygen, and alternating pulses of TDMAS and ozone/oxygen. Oxygen incorporation into the nitrogen-containing film during deposition of the oxygen-containing film oxidizes at a least a portion of the thickness of the nitrogen-containing film. In addition, oxygen incorporation may occur from the oxygen-containing film. Optionally, further oxygen incorporation may be achieved by additional ozone/oxygen exposure prior to, during, or after deposition of the nitrogen-containing film or after deposition of the oxygen-containing film.

EXAMPLE 7

Formation of a Bottom Nitrided Hafnium and Strontium Based High-k Film

A hafnium and strontium based nitrogen-containing film having a thickness between about 5 angstrom and about 10 angstrom is deposited onto a substrate at a substrate temperature between 100° C. and 400° C. using alternating pulses of TBAASr and ammonia, and alternating pulses of TEMAH and ammonia. Next, a hafnium and strontium based oxygen-containing film having a thickness between about 10 angstrom and about 30 angstrom is deposited onto the hafnium and strontium based nitrogen-containing film at a substrate temperature between 100° C. and 400° C. using alternating pulses of TBAASr and mixture of ozone/oxygen, and alternating pulses of TEMAH and mixture of ozone/oxygen. Oxygen incorporation into the nitrogen-containing film during deposition of the oxygen-containing film oxidizes at least a portion of the thickness of the nitrogen-containing film. In addition, oxygen incorporation may occur from the oxygen-containing film. Optionally, further oxygen incorporation may be achieved by additional ozone/oxygen exposure prior to, during, or after deposition of the nitrogen-containing film or after deposition of the oxygen-containing film.

EXAMPLE 8

Formation of a Bottom Nitrided Lanthanum and Aluminum Based High-k Film

A lanthanum and aluminum based nitrogen-containing film having a thickness between about 5 angstrom and about 10 angstrom is deposited onto a substrate at a substrate temperature between 100° C. and 400° C. using alternating pulses of $La(((iPr)_2N)_2CMe)_3$ and ammonia, and alternating pulses of trimethylaluminum (TMA) and ammonia. Next, a lanthanum and aluminum based oxygen-containing film having a thickness between about 10 angstrom and about 30 angstrom is deposited onto the lanthanum and aluminum based nitrogen-containing film at a substrate temperature between 100° C. and 400° C. using alternating pulses of La(((iPr)$_2$N)$_2$CMe)$_3$ and mixture of ozone/oxygen, and alternating pulses of trimethylaluminum (TMA) and mixture of ozone/oxygen. Oxygen incorporation into the nitrogen-containing film during deposition of the oxygen-containing film oxidizes at a least a portion of the thickness of the nitrogen-containing film. In addition, oxygen incorporation may occur from the oxygen-containing film. Optionally, further oxygen incorporation may be achieved by additional ozone/oxygen exposure prior to, during, or after deposition of the nitrogen-containing film or after deposition of the oxygen-containing film.

EXAMPLE 9

Formation of a Middle Nitrided Lanthanum and Aluminum Based High-k Film

A first (bottom) lanthanum and aluminum based oxygen-containing film having a thickness between about 5 angstrom and about 10 angstrom is deposited onto the substrate using alternating pulses of La(((iPr)$_2$N)$_2$CMe)$_3$ and mixture of ozone/oxygen and alternating pulses of trimethylaluminum (TMA) and ozone/oxygen. Next, a (middle) lanthanum and aluminum based nitrogen-containing film having a thickness between about 10 angstrom and about 30 angstrom may be deposited onto the first lanthanum and aluminum based oxygen-containing film using alternating pulses of La(((iPr)$_2$N)$_2$CMe)$_3$ and ammonia, and alternating pulses of trimethylaluminum (TMA) and ammonia. Next, a second (top) lanthanum and aluminum oxygen-containing film is deposited onto the nitrogen-containing film. The second lanthanum and aluminum based oxygen-containing film may have the same thickness as the first oxygen-containing film. Oxygen incorporation into the nitrogen-containing film during deposition of the second oxygen-containing film oxidizes at a least a portion of the thickness of the nitrogen-containing film. In addition, oxygen incorporation may occur from the first or second oxygen-containing films. Optionally, further oxygen incorporation may be achieved by additional ozone/oxygen exposure prior to, during, or after deposition of the nitrogen-containing film or after deposition of the first or second oxygen-containing films.

The preceding examples are not meant to limit or exclude use of other metal elements or metal-containing precursors in formation of the nitrided high-k films taught by embodiments of the invention. Furthermore, embodiments of the invention are not limited by the pulse sequences described in the preceding examples. It will be apparent to one skilled in the art that by adjusting the thicknesses of the nitrogen-containing films and the oxygen-containing films, or by adjusting the nitrogen-content in these films, nitrogen:oxygen ratios and nitrogen profiles across a thickness of the high-k films may be controlled to form a wide variety of different nitrided high-k films.

Figure 4A:
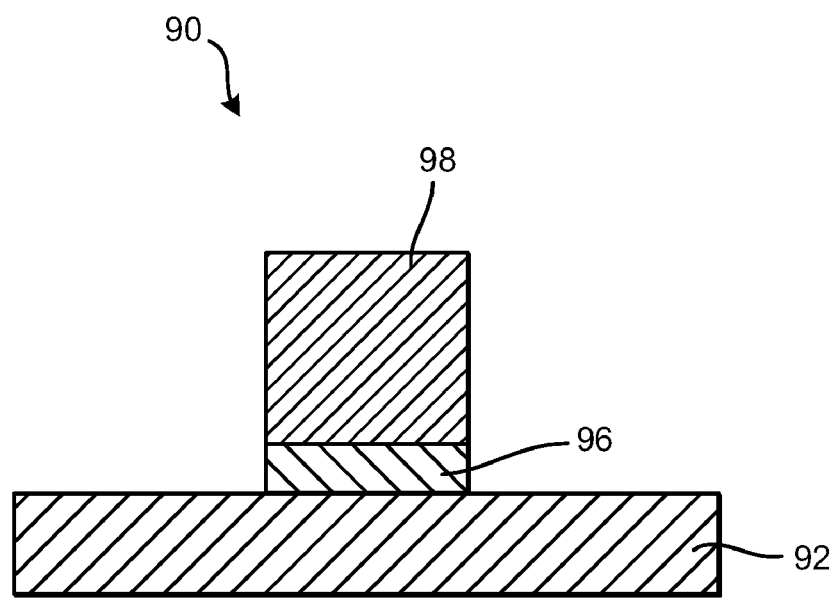
FIGS. 4A and 4B schematically show cross-sectional views of semiconductor devices containing nitrided high-k gate dielectric films according to embodiments of the invention.
Figure 4B:
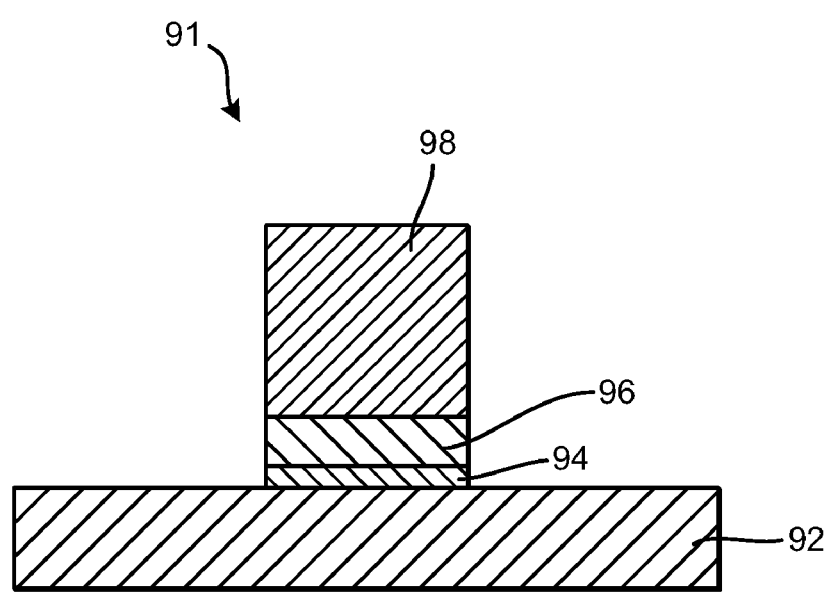

FIGS. 4A and 4B schematically show cross-sectional views of semiconductor devices containing nitrided high-k materials according to embodiments of the invention. In the schematic cross-sectional views, source and drain regions of the field emission transistors (FET) 90 and 91 are not shown. The FET 90 in FIG. 4A contains a semiconductor substrate 92, a nitrided high-k film 96 that serves as a gate dielectric, and a conductive gate electrode film 98 over the film 96. The nitrided high-k film 96 can contain any combination of nitrogen-containing films and oxygen-containing films. Nitrogen-containing films may be selected from metal nitride films, metal aluminum nitride films, metal silicon nitride films, and metal silicon aluminum nitride films. Oxygen-containing films may be selected from metal oxide films, metal aluminate films, metal silicate films, and metal silicon aluminate films.

A thickness of the nitrided high-k film 96 can be between about 5 and about 200 angstrom, or between about 5 and about 40 angstrom.

The FET 90 further contains a gate electrode film 98 that can, for example, be between about 5 nm and about 10 nm thick and can contain poly-Si, a metal, or a metal-containing material, including W, WN, WSi$_x$, Al, Mo, Ta, TaN, TaSiN, HfN, HfSiN, Ti, TiN, TiSiN, Mo, MoN, Re, Pt, or Ru.

The FET 91 in FIG. 4B is similar to the FET 90 in FIG. 4A but further contains an interface layer 94 between the nitrided high-k film 96 and the substrate 92. The interface layer 94 can, for example, be an oxide layer, a nitride layer, or an oxynitride layer.

According to other embodiments of the invention, the nitrided high-k films can be used in capacitors of dynamic random access memory (DRAM) devices, for example deep trench DRAM structures or stacked DRAM structures. In a deep trench DRAM structure, a capacitor may be built into a high aspect ratio (depth/width) trench etched into a semiconductor substrate. The aspect ratio of the deep trench can, for example be between about 25 and about 60, which can benefit from highly conformal deposition methods such as ALD and PEALD.

Although only certain exemplary embodiments of inventions have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of forming a nitrided high-k film, comprising: disposing a substrate in a process chamber; and
forming a high-k film on the substrate by:
  a) depositing and at least partially oxidizing a nitrogen-containing film by sequentially:
    1) exposing the substrate to a first metal-containing precursor, purging or evacuating the process chamber, and exposing the substrate to a nitrogen-containing gas to form a nitrogen-containing film, wherein step (1) is optionally repeated with purging or evacuating the process chamber therebetween; and
    (2) exposing the nitrogen-containing film formed in (1) to a first oxygen-containing gas to at least partially oxidize the nitrogen-containing film, and purging or evacuating the process chamber; and
  b) depositing an oxygen-containing film by sequentially:
    (3) exposing the at least partially oxidized nitrogen-containing film to a second metal-containing precursor, purging or evacuating the process chamber, and exposing the substrate to a second oxygen-containing gas so as to further oxidize at least portion of the thickness of the nitrogen-containing film, wherein step (3) is optionally repeated with purging or evacuating the process chamber therebetween; and c) optionally repeating steps a) and b), any number of times, with purging or evacuating the process chamber therebetween, wherein the first and second metal-containing precursors for depositing the nitrogen-containing film and the oxygen-containing film comprise the same one or more metal elements selected from alkaline earth elements, rare earth elements, and Group IVB elements of the Periodic Table, and optionally aluminum, silicon, or aluminum and silicon.

2. The method of claim 1, wherein the oxidized portion of the thickness of the nitrogen-containing film comprises a variable nitrogen:oxygen ratio.

3. The method of claim 2, wherein the nitrogen:oxygen ratio in the oxidized portion of the thickness of the nitrogen-containing film increases in the direction towards the substrate.

4. The method of claim 1, wherein the forming comprises ALD or PEALD.

5. The method of claim 1, wherein the nitrogen:oxygen ratio in the high-k film monotonically varies through the thickness thereof.

6. The method of claim 1, wherein the nitrogen-containing film and the oxygen-containing film each comprise hafnium.

7. The method of claim 1, wherein the nitrogen-containing film and the oxygen-containing film each comprise a plurality of metal elements selected from the alkaline earth elements, rare earth elements, and Group IVB elements.

8. The method of claim 1, wherein the nitrogen-containing film and the oxygen-containing film each comprise hafnium and silicon.

9. The method of claim 1, wherein the nitrogen-containing film and the oxygen-containing film each comprise hafnium and strontium.

10. The method of claim 1 wherein step a)(1) comprises:
i) sequentially first, exposing the substrate to a gas pulse comprising the first metal-containing precursor, wherein the first metal-containing precursor comprises one or more metal elements selected from alkaline earth elements, rare earth elements, and Group IVB elements; second, purging or evacuating the process chamber; and third, exposing the substrate to a gas pulse comprising the nitrogen-containing gas;
ii) sequentially first, exposing the substrate to a gas pulse comprising an aluminum or a silicon precursor; second, purging or evacuating the process chamber; and third, exposing the substrate to a gas pulse containing the nitrogen-containing gas,
wherein each of i) and ii) are repeated any number of desired times with purging or evacuating the process chamber therebetween.

11. The method of claim 10, wherein the nitrogen-containing gas comprises $NH_3$, $N_2H_4$, $C_1$-$C_{10}$ alkylhydrazine compounds, plasma excited nitrogen, NO, $NO_2$, or $N_2O$, or a combination of two or more thereof.

12. The method of claim 1, wherein step b) comprises
i) sequentially first, exposing the substrate to a gas pulse comprising the second metal-containing precursor, wherein the second metal-containing precursor comprises one or more metal elements selected from alkaline earth elements, rare earth elements, and Group IVB elements; second, purging or evacuating the process chamber; and third, exposing the substrate to a gas pulse comprising the oxygen-containing gas;
ii) sequentially first, exposing the substrate to a gas pulse comprising an aluminum or a silicon precursor; second, purging or evacuating the process chamber; and third, exposing the substrate to a gas pulse containing the oxygen-containing gas wherein each of i) and ii) are repeated any number of desired times with purging or evacuating the process chamber therebetween.

13. The method of claim 12, wherein the oxygen-containing gas comprises $O_2$, $H_2O$, $H_2O_2$, ozone, plasma excited oxygen, NO, $NO_2$, or $N_2O$, or a combination of two or more thereof.

14. The method of claim 12, wherein the one or more metal elements include hafnium, and wherein step ii) comprises a silicon precursor.

15. A method of forming a nitrided high-k film, comprising:
disposing a substrate in a process chamber; and
forming a high-k film on the substrate by:
a) depositing an oxygen-containing film by sequentially:
(1) exposing the substrate to a first metal-containing precursor, purging or evacuating the process chamber, exposing the substrate to a first oxygen-containing gas, and purging or evacuating the process chamber,
wherein step a) is optionally repeated any number of times;
b) depositing and at least partially oxidizing a nitrogen-containing film by sequentially:
(2) exposing the substrate to a second metal-containing precursor, purging or evacuating the process chamber, and exposing the substrate to a nitrogen-containing gas to form a nitrogen-containing film, wherein step (2) is optionally repeated any number of times with purging or evacuating the process chamber therebetween;
(3) exposing the nitrogen-containing film to a second oxygen-containing gas to at least partially oxidize the nitrogen-containing film, and purging or evacuating the process chamber;
4) repeating step a); and
c) optionally, repeating steps a) and b),
wherein the first and second metal-containing precursors comprise the same one or more metal elements selected from alkaline earth elements, rare earth elements, and Group IVB elements of the Periodic Table, and optionally aluminum, silicon, or aluminum and silicon.

16. The method of claim 15, wherein the oxidized portion of the thickness of the nitrogen-containing film comprises a variable nitrogen:oxygen ratio.

17. The method of claim 16, wherein the nitrogen:oxygen ratio in the oxidized portion of the thickness of the nitrogen-containing film increases in the direction towards the substrate.

18. The method of claim 15, wherein the nitrogen:oxygen ratio in the nitrided high-k film monotonically varies through the thickness thereof.

19. The method of claim 15, wherein the nitrogen-containing film, the oxygen-containing film, or both, further comprise aluminum.

20. The method of claim 15, further comprising:
exposing the nitrided high-k film to an oxygen-containing gas to further incorporate oxygen into the nitrided high-k film.

21. The method of claim 15, wherein step a)(1) comprises:
i) sequentially first, exposing the substrate to a gas pulse comprising the first metal-containing precursor, wherein the first metal-containing precursor comprises one or more metal elements selected from alkaline earth elements, rare earth elements, and Group IVB elements; second, purging or evacuating the process chamber; and third, exposing the substrate to a gas pulse comprising the oxygen-containing gas; and ii) sequentially first, exposing the substrate to a gas pulse comprising an aluminum or a silicon precursor; second, purging or evacuating the process chamber; and third, exposing the substrate to a gas pulse containing the oxygen-containing gas;

wherein each of i) and ii) are repeated any number of desired times with purging or evacuating the process chamber therebetween.

22. The method of claim 15, wherein step b) comprises:

i) sequentially first, exposing the substrate to a gas pulse comprising the second metal-containing precursor, wherein the second metal-containing precursor comprises one or more metal elements selected from alkaline earth elements, rare earth elements, and Group IVB elements; second, purging or evacuating the process chamber; and third, exposing the substrate to a gas pulse comprising the nitrogen-containing gas;

ii) sequentially first, exposing the substrate to a gas pulse comprising an aluminum or a silicon precursor; second, purging or evacuating the process chamber; and third, exposing the substrate to a gas pulse containing the nitrogen-containing gas;

iii) exposing the nitrogen-containing film to a second oxygen-containing gas to at least partially oxidize the nitrogen-containing film, and purging or evacuating the process chamber; and iv) repeating step a), wherein each of i) and ii) are repeated any number of desired times with purging or evacuating the process chamber therebetween.

* * * * *

UNITED STATES PATENT AND TRADEMARK OFFICE
CERTIFICATE OF CORRECTION

PATENT NO. : 7,767,262 B2  Page 1 of 1
APPLICATION NO. : 11/537245
DATED : August 3, 2010
INVENTOR(S) : Robert D. Clark It is certified that error appears in the above-identified patent and that said Letters Patent is hereby corrected as shown below:

Col. 1, Page 2, OTHER PUBLICATIONS, 10 lines down, "Atomic Layer Depositin" should read --Atomic Layer Deposition--.

Col. 5, line 33, "cyclepentadienyls" should read --cyclopentadienyls--.

Col. 15, line 27, "approximately one thirds" should read --approximately one third--.

Col. 16, line 35, "at a least a portion of" should read --at least a portion of--.

Col. 17, lines 41-42, "at a least a portion of" should read --at least a portion of--.

Col. 18, line 23, "at a least a portion of" should read --at least a portion of--.

Col. 19, lines 9-10, "at a least a portion of" should read --at least a portion of--.

Col. 19, line 39, "at a least a portion of" should read --at least a portion of--.

Col. 20, line 46, Claim 1, "1)" should read --(1)--.

Col. 20, line 63, Claim 1, "at least portion" should read --at least a portion--.

Col. 21, line 57, Claim 12, "step b) comprises" should read --step b) comprises:--.

Col. 22, line 3, Claim 12, "oxygen-containing gas" should read --oxygen-containing gas,--.

Signed and Sealed this

Sixteenth Day of November, 2010

David J. Kappos
*Director of the United States Patent and Trademark Office*